(12) United States Patent
Bowles et al.

(10) Patent No.: US 9,040,355 B2
(45) Date of Patent: May 26, 2015

(54) SENSOR PACKAGE AND METHOD OF FORMING SAME (75) Inventors: Philip H. Bowles, Fountain Hills, AZ (US); Paige M. Holm, Phoenix, AZ (US); Stephen R. Hooper, Mesa, AZ (US); Raymond M. Roop, Scottsdale, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 44 days.

(21) Appl. No.: 13/546,902

(22) Filed: Jul. 11, 2012

(65) Prior Publication Data

US 2014/0015123 A1 Jan. 16, 2014

(51) Int. Cl.
*H01L 21/00* (2006.01)
*B81B 7/00* (2006.01)
*B81C 1/00* (2006.01)

(52) U.S. Cl.
CPC ............ *B81B 7/0006* (2013.01); *B81C 1/0023* (2013.01); *H01L 2224/48091* (2013.01); *H01L 2224/48464* (2013.01); *H01L 2924/1461* (2013.01); *B81B 7/0077* (2013.01); *B81B 2201/02* (2013.01)

(58) Field of Classification Search
USPC .......... 438/113, 118, 455, 456, 459; 257/414, 257/685, 686, 678, 704, 737, E21.499
See application file for complete search history.

(56) References Cited

U.S. PATENT DOCUMENTS

| | | | |
|---|---|---|---|
| 6,522,015 B1 | 2/2003 | Glenn et al. | |
| 6,838,776 B2 | 1/2005 | Leal et al. | |
| 6,853,067 B1 | 2/2005 | Cohn et al. | |
| 6,921,975 B2 | 7/2005 | Leal et al. | |
| 7,202,560 B2 * | 4/2007 | Dungan et al. | 257/713 |
| 7,352,039 B2 * | 4/2008 | Garcia | 257/415 |
| 7,368,808 B2 * | 5/2008 | Heck et al. | 257/678 |
| 7,419,853 B2 | 9/2008 | Kuhmann et al. | |
| 7,446,017 B2 | 11/2008 | Liu et al. | |
| 7,858,440 B2 | 12/2010 | Pressel et al. | |

(Continued)

FOREIGN PATENT DOCUMENTS

| | | |
|---|---|---|
| WO | 02056031 A1 | 7/2002 |
| WO | 2007017757 A2 | 2/2007 |

OTHER PUBLICATIONS

European Patent Office, "European Search Report for Application No. 13173238.0", Jul. 15, 2014, pp. 1-9, Germany.

(Continued)

*Primary Examiner* — Kenneth Parker
*Assistant Examiner* — John Lin
(74) *Attorney, Agent, or Firm* — Charlene R. Jacobsen (57) ABSTRACT

A method (70) of forming sensor packages (20) entails providing a sensor wafer (74) having sensors (30) formed on a side (26) positioned within areas (34) delineated by bonding perimeters (36), and providing a controller wafer (82) having control circuitry (42) at one side (38) and bonding perimeters (46) on an opposing side (40). The bonding perimeters (46) of the controller wafer (82) are bonded to corresponding bonding perimeters (36) of the sensor wafer (74) to form a stacked wafer structure (48) in which the control circuitry (42) faces outwardly. The controller wafer (82) is sawn to reveal bond pads (32) on the sensor wafer (74) which are wire bonded to corresponding bond pads (44) formed on the same side (38) of the wafer (82) as the control circuitry (42). The structure (48) is encapsulated in packaging material (62) and is singulated to produce the sensor packages (20).

15 Claims, 8 Drawing Sheets

(56) References Cited

U.S. PATENT DOCUMENTS

| | | |
|---|---|---|
| 7,868,729 B2 | 1/2011 | Wang et al. |
| 8,124,435 B2 | 2/2012 | Kuisma |
| 8,154,126 B2 | 4/2012 | Voelz |
| 2005/0166677 A1 | 8/2005 | Nasiri et al. |
| 2006/0208326 A1 | 9/2006 | Nasiri et al. |
| 2006/0216857 A1 | 9/2006 | Zhao |
| 2010/0148341 A1 | 6/2010 | Fuji et al. |
| 2011/0018084 A1 | 1/2011 | Shim et al. |
| 2011/0221042 A1 | 9/2011 | Karlin et al. |
| 2011/0250721 A1 | 10/2011 | Bowles et al. |

OTHER PUBLICATIONS

Becker, K. F., et al., "Stackable System-On-Packages With Integrated Components", IEEE Transactions on Advanced Packaging, vol. 27, No. 2, May 2004, pp. 268-277.

* cited by examiner

SENSOR PACKAGE AND METHOD OF FORMING SAME

TECHNICAL FIELD OF THE INVENTION

The present invention relates generally to semiconductor packaging. More specifically, the present invention relates to wafer level semiconductor packaging for forming sensor packages.

BACKGROUND OF THE INVENTION

Microelectronic device technology has achieved wide popularity in recent years, as it provides a way to make very small electronic and mechanical structures and integrate these structures on a single substrate using conventional batch semiconductor processing techniques. While such microelectronic devices are becoming mainstream technologies, cost effectively packaging them in semiconductor packages for manufacture and ease of use remains challenging. Indeed, packaging is one of the major cost drivers for such devices.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Semiconductor packages generally provide a set of related elements. These elements include, for example, one or more semiconductor devices to be packaged, interconnection from the devices to the package, a surrounding or containing structure to provide both mechanical support and electrical, chemical, and environmental protection, and a joining structure to attach the package to the board or system. The challenges faced by developers of semiconductor packaging processes result from, for example, the sensitivity of the semiconductor devices (e.g., microelectronics and microstructures) to high temperature processes, the need for suitable shielding, the requirement in some instances for a hermetic or near-hermetic seal to protect the devices from contaminants, and so forth.

One or more of the semiconductor devices in a semiconductor package may be a microelectronic sensor (e.g., a magnetometer), a microelectromechanical systems (MEMS) sensor (e.g., an accelerometer, gyroscope, pressure sensor), or some other miniaturized sensor. With regard to such sensors, proper packaging is important to ensure the integrity of the signals to and from the sensor devices. For example, angular misalignment of a sensor device or multiple sensor devices in a sensor package can lead to inaccuracies in the measured signals. As such, precise angular alignment of sensors in a sensor package is critical for receiving accurate measurements.

Angular alignment of sensors in traditional chip level packaging is currently limited to approximately plus or minus two degrees of accuracy. The angular alignment accuracy is limited by the tolerance of placement equipment utilized in die placement techniques. More precise angular alignment is being called for in the industry to improve the accuracy of measurements received from such sensors. As integrated circuit (IC) device geometries continue to decrease, the use of miniaturized sensor devices continues to rise, and the fabrication of semiconductor packages containing multiple microelectronic components continue to evolve, the need for low cost, accurate, reliable, high density packaging solutions increases.

Embodiments entail sensor packaging methodology and a sensor package produced in accordance with the packaging methodology. The packaging methodology involves a wafer-level packaging technique in lieu of traditional die-to-die placement techniques. Wafer-level packaging refers to packaging semiconductor devices at wafer level, and essentially extends the wafer fabrication process to include device interconnection and device protection processes. The wafer-level packaging process discussed herein provides high-throughput and precise placement packaging of sensors at relatively low cost. Additional advantages entail a chip-scale packaging technology that results in the sensor package being generally the same size as the die, stacking of sensors and microelectronic devices for size reduction, improved electrical performance, and so forth.

Figure 1:
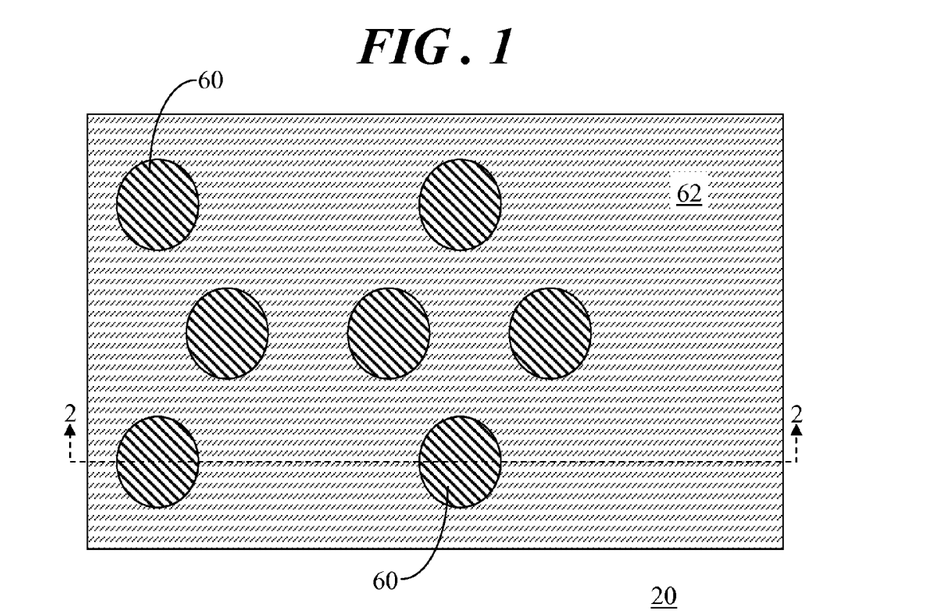
FIG. 1 shows a top view of an exemplary sensor package in accordance with an embodiment.
Figure 2:
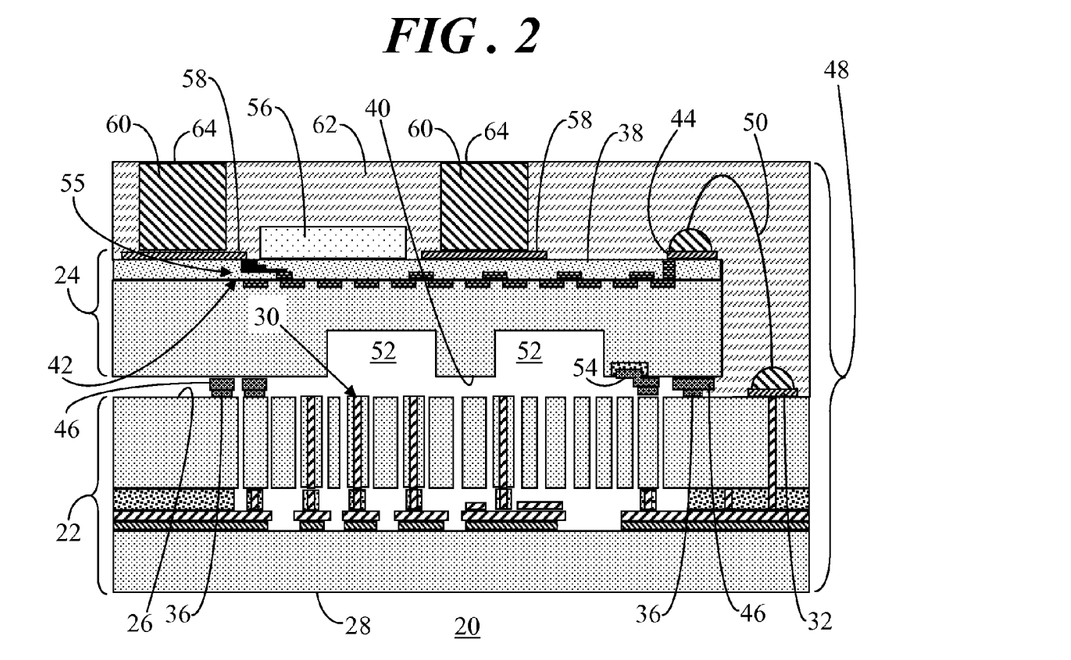
FIG. 2 shows a side view of the sensor package along section lines 2-2 in FIG. 1.

Referring now to FIGS. 1 and 2, FIG. 1 shows a top view of an exemplary sensor package 20 in accordance with an embodiment, and FIG. 2 shows a side view of sensor package 20 along section lines 2-2 in FIG. 1. In general, sensor package 20 includes a semiconductor die in the form of a sensor element 22 and another semiconductor die in the form of a controller element 24 bonded to sensor element 22.

Sensor element 22 has a side 26 and another side 28 opposing side 26. In FIG. 2, side 26 is shown as being physically positioned above side 28. As such, side 26 is referred to as an upper side 26 and the opposing side 28 is referred to as a lower side 28 for clarity of discussion. A sensor 30 and bond pads 32 are formed at upper side 26 of sensor element 22. Sensor 30 is positioned within an area 34 (best seen in FIG. 5) on upper side 26 delineated by a bonding perimeter 36 (best seen in FIG. 5). Bond pads 32 are positioned outside of area 34, external to bonding perimeter 36. Bond pads 32 may be electrically connected to various structures of sensor 30 by way of conductive vias, conductive material layers, and so forth in accordance with conventional and upcoming sensor device manufacturing processes. These electrical interconnections are not illustrated or described in detail herein for brevity of discussion. Sensor 30 may be a microelectromechanical systems (MEMS) sensor device such as an accelerometer, gyroscope, or some other sensor. However, sensor 30 need not be limited to a MEMS sensor configuration. Additionally, although sensor 30 is mentioned in singular form herein, in alternative embodiments, upper side 26 of sensor element 22 may include more than one sensor device positioned within area 34.

Controller element 24 also has a side 38 and another side 40 opposing side 38. In FIG. 2, side 38 is shown as being physically positioned above side 40. As such, side 38 is referred to as an upper side 38 and the opposing side 40 is referred to as a lower side 40 for clarity of discussion. Upper side 38 includes control circuitry 42 and bond pads 44 formed thereon. Lower side 40 includes a bonding perimeter 46 (best seen in FIG. 12) configured to abut bonding perimeter 36 of sensor element 22. Bonding perimeter 46 of controller element 24 is coupled to bonding perimeter 36 to form a stacked wafer structure 48 in which at least lower side 40 of controller element 24 is co-aligned with upper side 26 of sensor element 22. Control circuitry 42 may be any active or passive circuitry used in the "active area" of controller element 24 and used to communicate signals to and from sensor 30. Bond wires 50 are attached between corresponding bond pads 32 on upper side 26 of sensor element 22 and bond pads 44 on upper side 38 of controller element 24 to provide suitable electrical interconnections between controller element 24 and sensor element 22.

In an embodiment, features may be formed on lower side 40 of controller element 24. In accordance with particular design criteria for sensor package 20, these features can include functional components of sensor 30 located on upper side 26 such as, one or more cavities 52 and one or more electrodes 54. Cavities 52 and electrodes 54 may be formed within the boundary of bonding perimeter 46 and are generally aligned with sensors 30.

In some embodiments, a sensor 55 may be formed integrally with the passive and active elements of control circuitry 42 within controller element 24 in accordance with conventional and upcoming semiconductor manufacturing processes. The various elements of control circuitry 42 and the integral sensor 55 are represented by the variety of shading and elements internal to controller element 24. In lieu of, or in addition to, integral sensor 55, sensor package 20 may include a sensor die 56 mounted on upper side 38 of controller element 24. In an embodiment, integral sensor 55 or sensor die 56 may be a magnetometer for measuring the strength or direction of magnetic fields. However, integral sensor 55 or sensor die 56 may be some other sensor device in accordance with particular design criteria for sensor package 20.

Controller element 24 further includes bump pads 58 formed on and distributed across upper side 38. In an embodiment, conductive elements 60 are formed on bump pads 58 after controller element 24 is bonded to sensor element 22. Conductive elements 60 may be pillars, balls, plugs, or some other conductive features that extend above bump pads 58. Conductive elements 60 are utilized as input/output elements for sensor package 20.

A packaging material 62 is applied over upper side 38 of controller element 24 to encapsulate control circuitry 42, sensor element 22, and bond wires 50, and to at least partially encapsulate conductive elements 60 so that only a top side 64 of conductive elements 60 is exposed from packaging material 62. Packaging material 62 may be any conventional molding compound such as, for example, an epoxy resin material. Sensor package 20 is provided herein for exemplary purposes. However, sensor package 20 may take on a wide variety of forms, sizes, shapes, and functions in accordance with particular design criteria.

Figure 3:
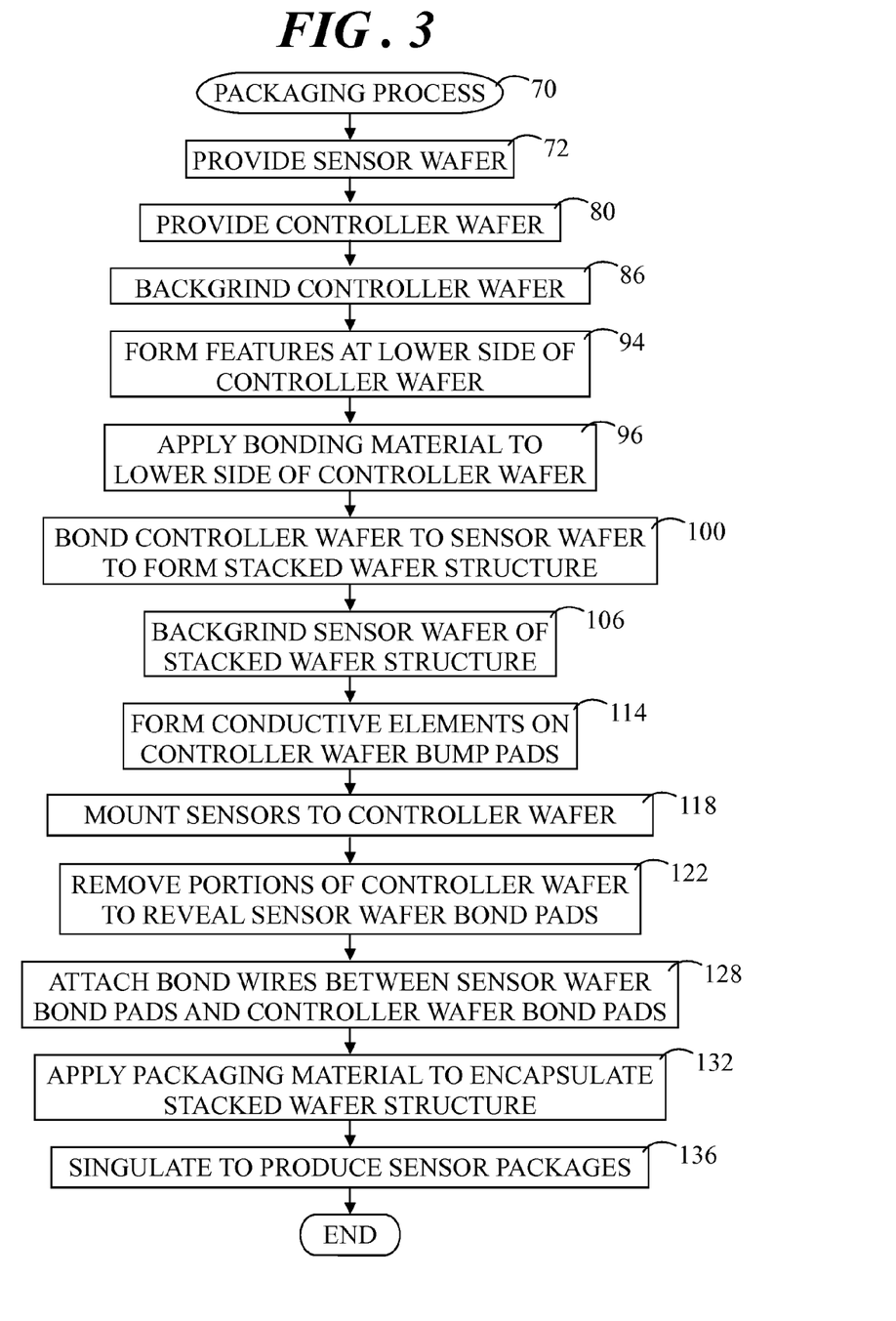
FIG. 3 shows a flowchart of a packaging process for fabricating the sensor package of FIG. 1 in accordance with another embodiment.

FIG. 3 shows a flowchart of a packaging process 70 for fabricating sensor package 20 of FIG. 1 in accordance with another embodiment. Packaging process 70 sets forth a wafer-level packaging technique in which semiconductor dies are packaged while still in the wafer followed by wafer dicing, in lieu of traditional die placement techniques. Packaging process 70 will be discussed in connection with the packaging of a plurality of sensor packages 20 (FIG. 1). However, it should become apparent that the following methodology can be adapted to packaging methodology for a multiplicity of semiconductor designs. Packaging process 70 sets forth an exemplary flow of operations for clarity of discussion. However, in actual practice there may be variations in the order of operations in accordance with particular processing capabilities of a packaging facility.

Packaging process 70 begins with an activity 72. At activity 72, a sensor wafer is provided with a multiplicity of sensors 30 (FIG. 2) formed thereon. The sensor wafer may be provided from a device manufacturer and packaged in accordance with packaging process 70 at a separate packaging facility. Alternatively, the sensor wafer may be fabricated and packaged within the same manufacturing facility.

Figure 4:
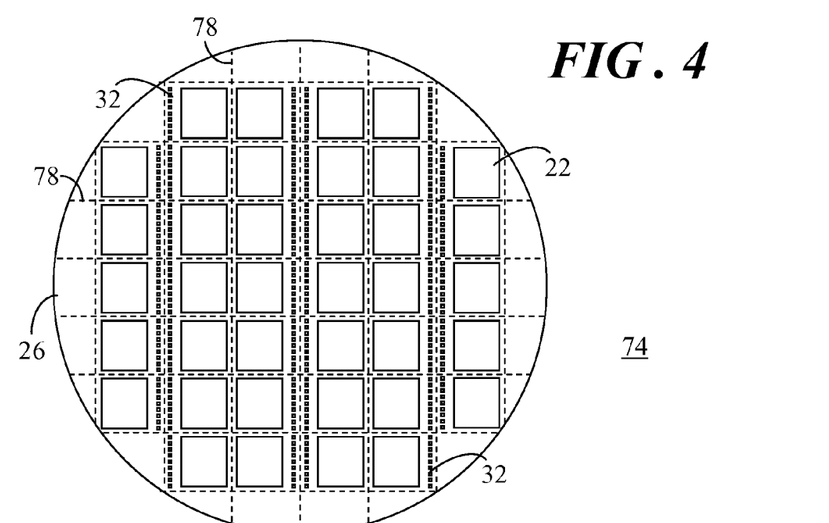
FIG. 4 shows a top view of a sensor wafer used in connection with the packaging process.
Figure 5:
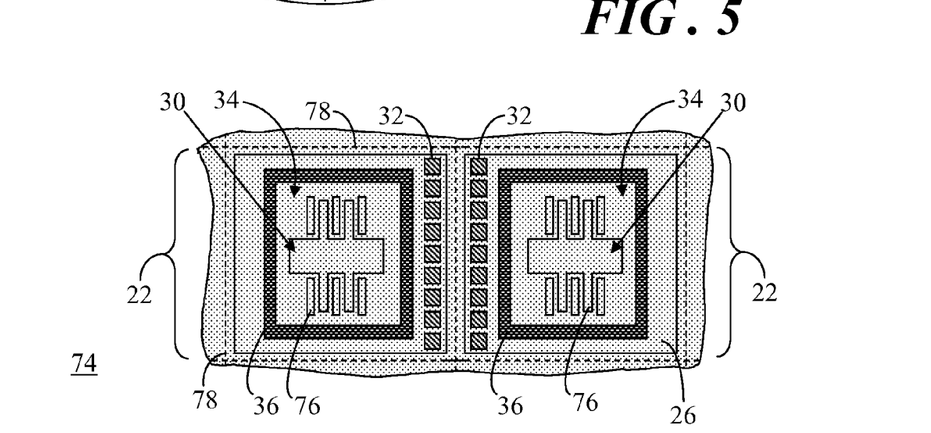
FIG. 5 shows a partial top view of the sensor wafer with sensors formed on a side thereof.
Figure 6:
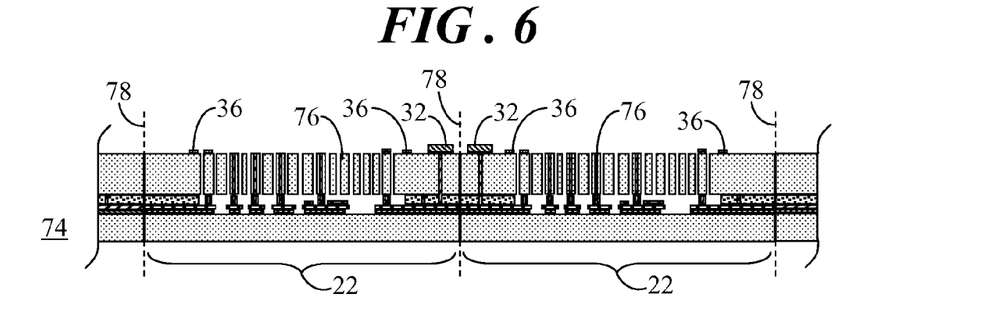
FIG. 6 shows a partial side sectional view of the sensor wafer of FIG. 4.

Referring to FIGS. 4-6 in connection with activity 72, FIG. 4 shows a top view of a sensor wafer 74 used in connection with packaging process 70. FIG. 5 shows a partial top view of sensor wafer 74 with sensors 30 formed on upper side 26 thereof, and FIG. 6 shows a partial side sectional view of sensor wafer 74. The following FIGS. 4-20 may be illustrated using various shading and/or hatching to distinguish the different elements, as will be discussed below. These different elements may be produced utilizing current and upcoming micromachining techniques.

FIG. 4 particularly illustrates an exemplary sensor wafer 74 having a plurality of sensor elements 22 formed on a silicon-based substrate. Sensor elements 22 may be any of a plurality of sensor devices such as inertial sensors, gyroscopes, optical devices, pressure sensors, magnetic field sensors, switches, microphones, and so forth. However, in alternative embodiments, sensor elements 22 may be any other device in which it is desirable to individually protect, i.e., cap, sensitive features and additionally expose or reveal terminal elements, i.e., bond pads 32 (FIG. 2) at the wafer level.

Sensor wafer 74 may be manufactured utilizing conventional and upcoming bulk micromachining, surface micromachining, and/or high aspect ratio silicon micromachining techniques. Fabrication processes for a surface micromachining technique can generally include, for example, deposition, patterning, and etching of one or more sacrificial oxide layers, one or more structural polysilicon layers, and the like. For example, one or more sacrificial oxide layers may be deposited overlying the silicon-based wafer, and one or more structural layers may then be deposited over the sacrificial layers. A structural layer can then be suitably patterned and etched to form the movable and non-movable microstructures 76 of sensors 30, as well as bond pads 32 of sensor elements 22. Additionally, deposition of a bonding material, such as a metallization layer, at bonding perimeter 36 may be performed. The bonding material will form part of a seal ring between sensor wafer 74 and a controller wafer (discussed below).

All elements on sensor wafer 74 may be identical, or sensor wafer 74 can contain a mixture of sensor elements. Dashed lines 78 (of which only a few are shown in FIG. 4) represent borders delineating the various sensor elements 22 formed on sensor wafer 74. Dashed lines 78 can additionally represent the locations at which sensor wafer 74 will eventually be singulated (discussed below). Thus, dashed lines 78 are referred to hereinafter as saw lines 78. Sensor wafer 74 is illustrated as being generally disk-shaped. However, alternative embodiments of sensor wafer 74 may be any suitable shape, such as rectangular shaped. The quantity of sensor elements 22 formed on a given sensor wafer 74 varies depending upon the size of sensor elements 22 and upon the size of sensor wafer 74.

With reference back to packaging process 70 (FIG. 3), following the provision of sensor wafer 74 at activity 72, packaging process 70 continues with an activity 80. At activity 80, a controller wafer is provided with a multiplicity of controller elements 24 (FIG. 2) formed thereon. The controller wafer may be provided from a device manufacturer and packaged in accordance with packaging process 70 at a separate packaging facility. Alternatively, the controller wafer may be fabricated and packaged within the same manufacturing facility.

Figure 7:
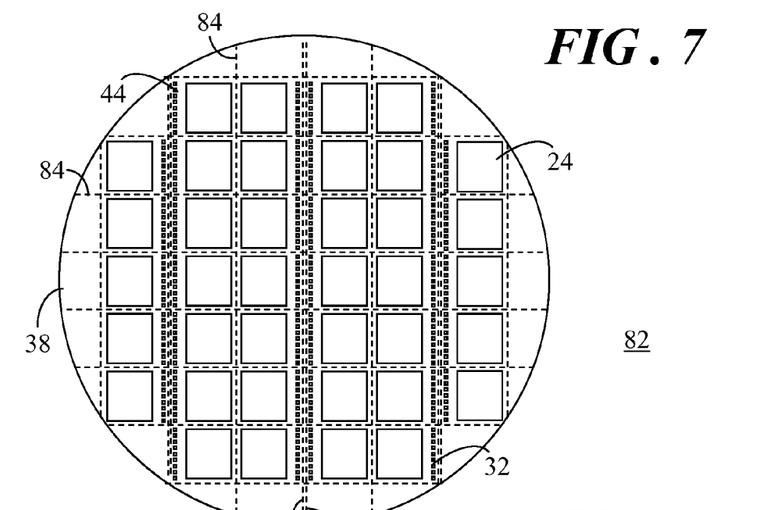
FIG. 7 shows a top view of a controller wafer used in connection with the packaging process.
Figure 8:
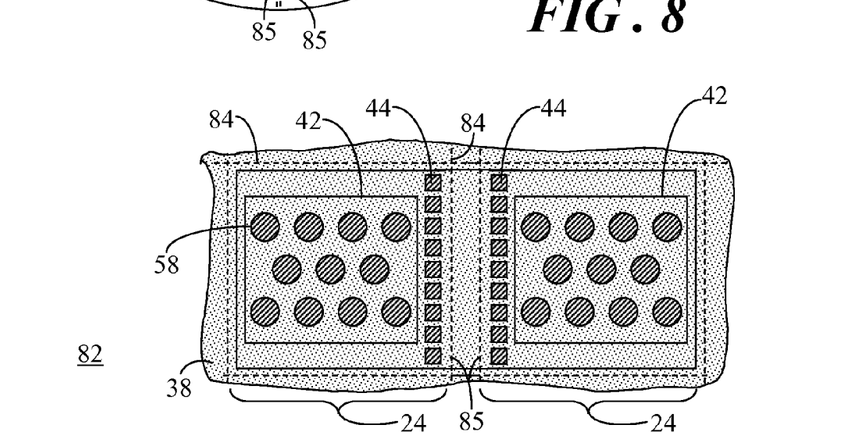
FIG. 8 shows an enlarged partial top view of the controller wafer.
Figure 9:
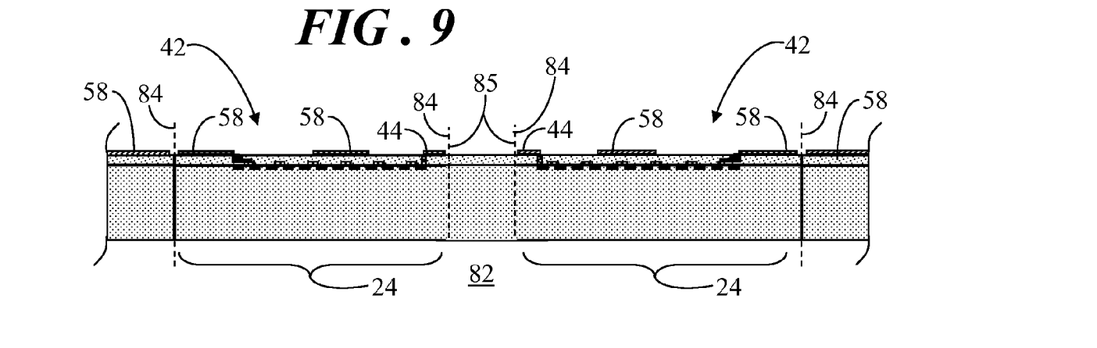
FIG. 9 shows a partial side sectional view of the controller wafer of FIG. 7.

Referring to FIGS. 7-9 in connection with activity 80, FIG. 7 shows a top view of a controller wafer 82 used in connection with packaging process 70. FIG. 8 shows an enlarged partial top view of controller wafer 82 with connections to control circuitry 42 (generally represented by rectangles) of controller elements 24 on upper side 38, and FIG. 9 shows a partial side sectional view of controller wafer 82. Controller wafer 82 may be manufactured utilizing conventional and upcoming integrated circuit (IC) fabrication techniques for forming control circuitry 42 in the active regions of controller wafer 82. The implementation of standard IC wafer fabrication techniques creates transistors, capacitors, resistors, diodes, and all other components of control circuitry 42. In addition, these IC fabrication techniques may be implemented to form bond pads 44 and bumps pads 58 at upper side 38 of controller wafer 82. These conventional process steps need not be described herein.

Upper side 38 of controller wafer 82 is marked with dashed lines 84 along the generally planar upper side 38 of controller wafer 82. Dashed lines 84 represent the locations at which controller wafer 82 will be sawn or diced in at least two separate operations. For example, in the illustrated embodiment, immediately adjacent pairs 85 of vertically arranged dashed lines 84 represent the locations at which portions (discussed below) of controller wafer 82 will be removed in order to access bond pads 32 (FIG. 4) of the underlying sensor wafer 74 (FIG. 4). The remaining dashed lines 84 represent the locations at which controller wafer 82 will eventually be singulated (discussed below) concurrent with singulation of sensor wafer 74. Dashed lines 84 are collectively referred to herein as saw lines 84.

Controller wafer 82 is illustrated as being generally disk-shaped to correspond with sensor wafer 74 (FIG. 4). However, alternative embodiments of controller wafer 82 may be any suitable shape, such as rectangular shaped. Additionally, the quantity of controller elements 24 formed on a given controller wafer 82 varies depending upon the size of controller elements 24 and upon the size of controller wafer 82.

With reference back to FIG. 3, following the provision of controller wafer 82 (FIG. 7) at activity 80, packaging process 70 continues with an activity 86. At activity 86, controller wafer 82 undergoes a backgrinding process to thin wafer 82. In particular, lower side 40 undergoes backgrinding, also referred to as wafer thinning, using a conventional abrasive material and equipment.

Figure 10:
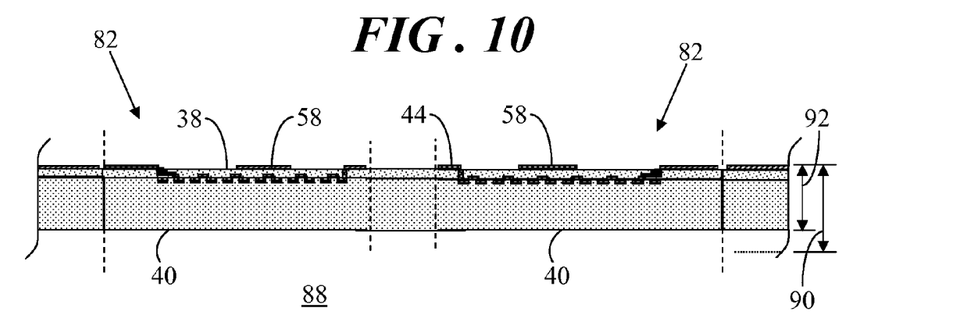
FIG. 10 shows a partial side sectional view of the controller wafer at an initial stage of packaging in accordance with the packaging process.

Referring to FIG. 10 in connection with activity 86, FIG. 10 shows a partial side sectional view of controller wafer 82 at an initial stage 88 of packaging in accordance with packaging process 70. As represented in FIG. 10 by a dotted line, controller wafer 82 exhibits an initial thickness 90 when it is provided for packaging at activity 80. Initial thickness 90 of controller wafer 88 may be roughly seven hundred fifty microns thick. Wafer backgrinding is a semiconductor device fabrication operation in which wafer thickness is reduced to enable stacking and high density packaging of semiconductor devices. As further shown in FIG. 10, a final thickness 92 of controller wafer 82 following execution of backgrinding activity 86 is less than initial thickness 90. Final thickness 92 can be any suitable dimension that is as thin as possible without unduly sacrificing mechanical stability, while still enabling features, e.g., cavities 52 (FIG. 2) and/or electrodes 54 (FIG. 2) to be formed at lower side 40 of controller wafer 82. For example, final thickness 92 of controller wafer 82 may be roughly five hundred microns.

Referring back to FIG. 3, following backgrinding activity 86, packaging process 70 continues with an activity 94. At activity 94, features such as cavities 52 and/or electrodes 54 (FIG. 2) may be formed at lower side 40 of controller wafer 82 in accordance with particular design criteria for sensor package 20 (FIG. 2). Packaging process 70 continues with an activity 96 at which a bonding material is applied to lower side of controller wafer 82.

Figure 11:
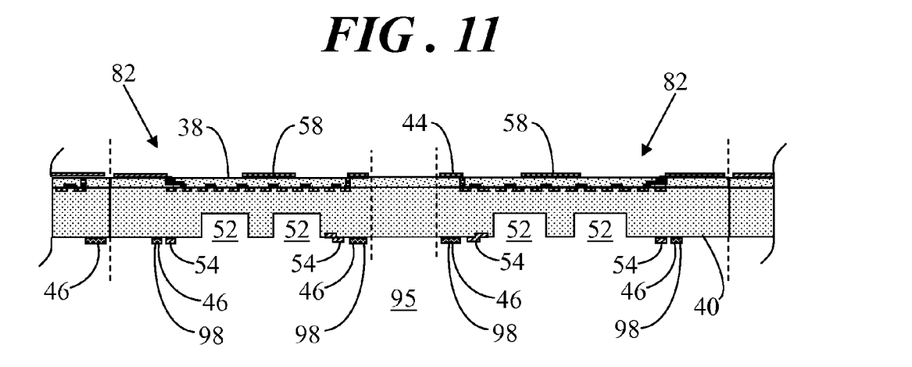
FIG. 11 shows a partial side sectional view of the controller wafer of FIG. 10 at a subsequent stage of packaging.
Figure 12:
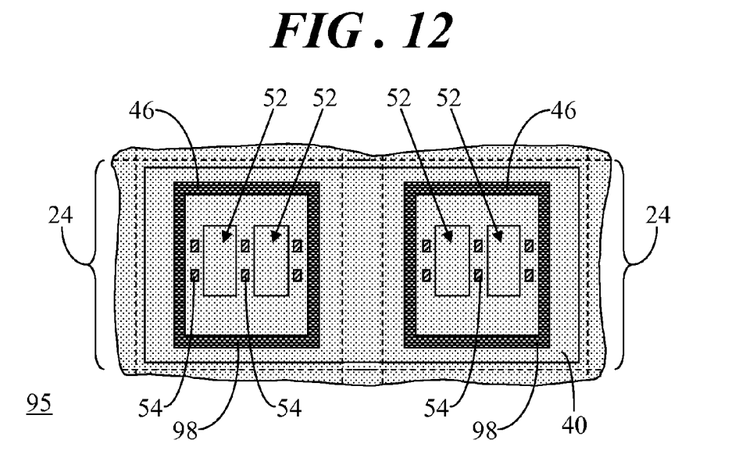
FIG. 12 shows a partial bottom view of the controller wafer of FIG. 11.

Referring FIGS. 11 and 12 in connection with activities 94 and 96, FIG. 11 shows a partial side sectional view of controller wafer 82 of FIG. 10 at a subsequent stage 95 of packaging, and FIG. 12 shows a partial bottom view of controller wafer 82 at subsequent stage 96. At activity 94, cavities 52 may be created from lower side 40 extending partially through controller wafer 82. Cavities 52 may be formed by etching through controller wafer 82 from lower side 40. For example, cavities 52 may be created by performing a deep-reactive ion etch (DRIE) process, another anisotropic etch process, a silicon etch process, and so forth to form cavities 52 in controller wafer 82.

In addition, electrodes 54 may be formed on lower side 40 by, for example, the conventional semiconductor processes of deposition, patterning, and etching of insulating and conductive material. As known to those skilled in the art, electrodes 54 should be electrically isolated form the bulk semiconductor silicon of controller element 24 by an insulating layer. This insulating layer is not distinctly shown for simplicity of illustration.

Furthermore, application of a bonding layer 98 at bonding perimeter 46 can be performed. Bonding layer 98 will form part of a seal ring between bonding perimeter 36 (FIG. 5) of sensor wafer 74 and bonding perimeter 46 of controller wafer 82. In an embodiment, bonding layer 98 may be metallization. The term metallization refers to a metal layer that serves primarily as a means of electrical contact and interconnection within semiconductor devices. In addition, a metal layer is typically utilized in order to avoid contamination of other systems, such as a chemical vapor deposition (CVD) system, an epi deposition system, and the like. Thin-film aluminum is the most widely used metallization in semiconductor manufacturing, and may be deposited by sputtering, dual source evaporation or electroplating. However, many other metals or alloys can be used for the same purpose. Alternatively, a non-metal may be used, such as germanium. In this example, electrodes 54 may be formed concurrent with the application of bonding layer 98 to bonding perimeter 46. However, electrodes 54 may alternatively be formed in a different process.

With its application at bonding perimeter 46, bonding material 98 (e.g., metallization) will be utilized as the bonding agent between bonding perimeter 36 (FIG. 5) of sensor wafer 74 (FIG. 5) and bonding perimeter 46 of controller wafer 82. It should be recalled that bonding material 98 may alternatively or additionally be applied to bonding perimeter 36 of sensor wafer 74, as mentioned above.

Now referring back to FIG. 3, following activities 94 and 96, packaging process 70 continues with an activity 100. At activity 100, controller wafer 82 is bonded to sensor wafer 74 to form stacked wafer structure 48 (FIG. 2).

Figure 13:
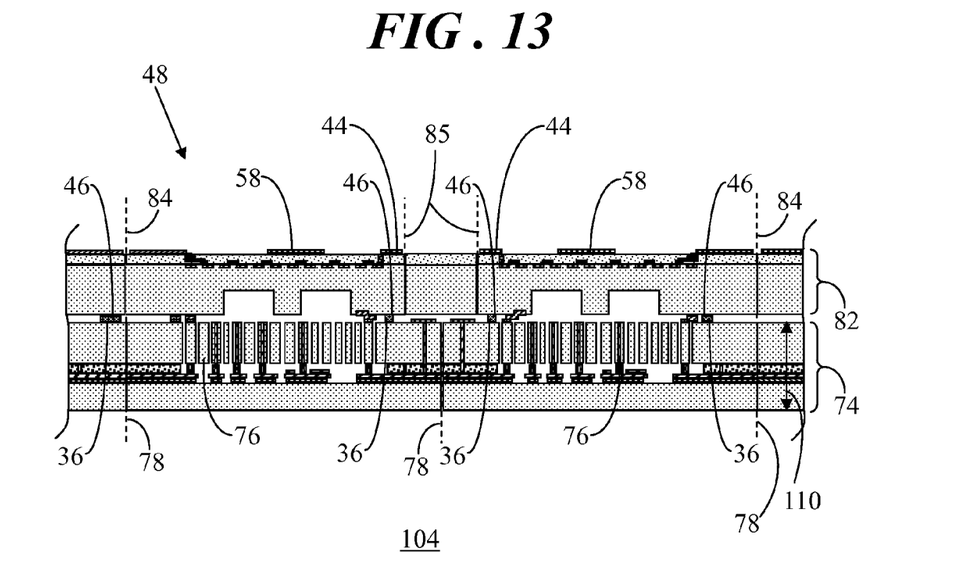
FIG. 13 shows a partial side sectional view of the controller wafer bonded to the sensor wafer to form a stacked wafer structure at a subsequent stage of packaging.

With reference to FIG. 13 in connection with activity 100, FIG. 13 shows a partial side sectional view of controller wafer 82 bonded to sensor wafer 74 to form stacked wafer structure 48 at a subsequent stage 104 of packaging. More particularly, bonding perimeters 46 located on lower side 40 of controller wafer 82 are bonded to corresponding bonding perimeters 36 of sensor wafer 74. Thus, following bonding activity 100, controller wafer 82 becomes a cap for protecting the movable and non-movable microstructures 76 located at upper side 26 of sensor wafer 74.

Bonding may be performed utilizing, for example, eutectic bonding. Eutectic bonding, also referred to as eutectic soldering, refers to a wafer bonding technique with an intermediate eutectic metal layer, e.g., metallization 98 (FIG. 12). A eutectic metal layer is an alloy that transforms directly from solid to liquid state, or vice versa, at a specific composition and temperature without passing a two-phase equilibrium, i.e., liquid and solid state. Therefore, the eutectic temperature of the eutectic metal layer can be much lower than the melting temperature of the two or more pure elements that make up the eutectic metal layer.

Eutectic bonding is able to produce hermetically sealed packages and electrical interconnection at relatively low processing temperatures using a single process. Additional attributes of eutectic bonding include low resultant stress induced in final assembly, high bonding strength, large fabrication yield, and a good reliability. Although, eutectic bonding is discussed therein, it should be understood that any other suitable bonding technique may alternatively be implemented.

Alignment of controller wafer 82 with sensor wafer 74 may be achieved by utilizing mechanical or optical fiducial marks, such as notches at the edges of wafers 74 and 82, pins, etchings, or holographic images, among others. Automatic process equipment for silicon wafer bonding, as well as the integration of suitable alignment techniques, can provide precision location keyed to specific features on the semiconductor elements of wafers 74 and 82. Thus, angular alignment of less than one tenth of a degree of accuracy for the sensors may be achieved. This alignment accuracy is in contrast with the angular alignment of sensors achieved in traditional chip level die packaging, which is typically limited to approximately plus or minus two degrees of accuracy.

Referring back to FIG. 3, packaging process 70 continues with an activity 106 following bonding activity 100. At activity 106, sensor wafer 74 of stacked wafer structure 48 (FIG. 13) undergoes a backgrinding, or wafer thinning process using a conventional abrasive material and equipment.

Figure 14:
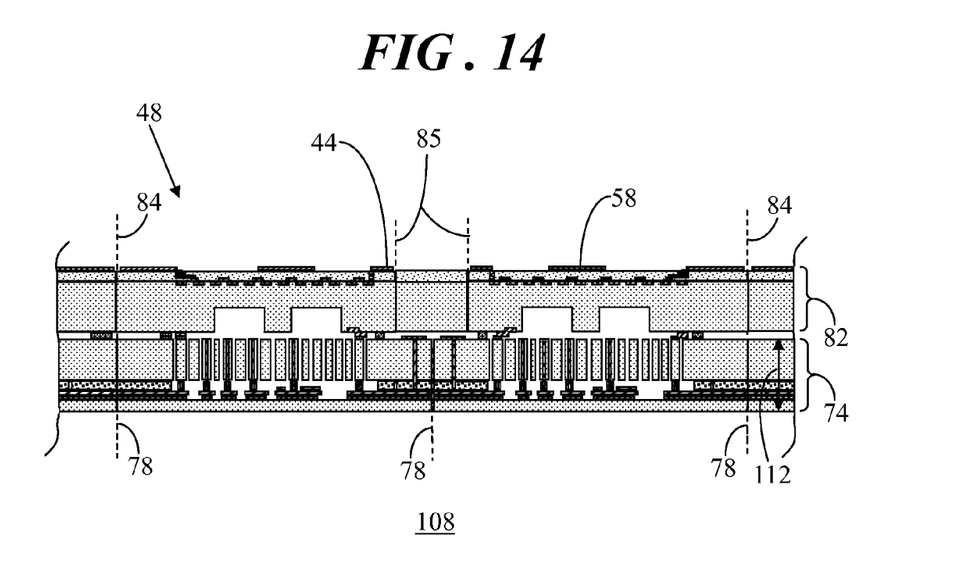
FIG. 14 shows a partial side sectional view of the stacked wafer structure of FIG. 13 at a subsequent stage of packaging.

Referring to FIGS. 13 and 14 in connection with activity 106, FIG. 14 shows a partial side sectional view of stacked wafer structure 48 at a subsequent stage 108 of packaging. As shown in FIG. 13, sensor wafer 74 exhibits an initial thickness 110 when it is provided for packaging at activity 72 (FIG. 3). Initial thickness 110 of sensor wafer 74 may be roughly 700 microns or greater. Wafer backgrinding can be performed to reduce the thickness of sensor wafer 74. As shown in FIG. 14, a final thickness 112 of sensor wafer 74 following execution of backgrinding activity 106 is less than initial thickness 110. For example, final thickness 112 of sensor wafer 74 following backgrinding may be roughly three hundred microns.

With reference back to FIG. 3, following backgrinding activity 106, packaging process 70 continues with an activity 114. At activity 114, conductive elements 60 (FIG. 2) are formed on bump pads 58 (FIG. 9) of controller wafer 82 (FIG. 9).

Figure 15:
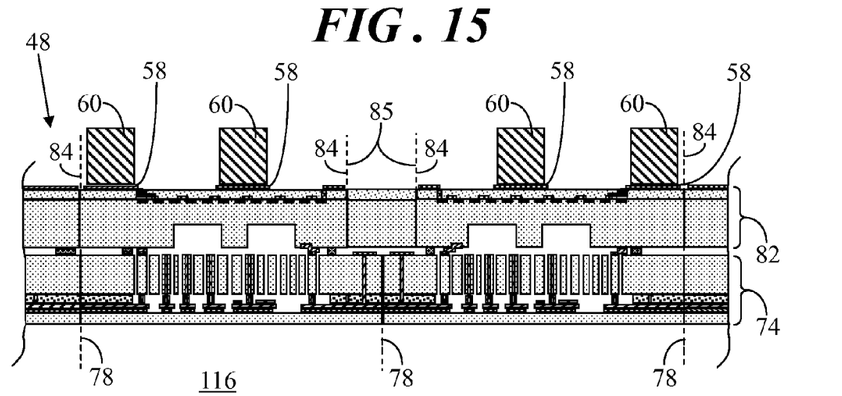
FIG. 15 shows a partial side sectional view of the stacked wafer structure of FIG. 14 at a subsequent stage of packaging.

Referring to FIG. 15 in connection with activity 114, FIG. 15 shows a partial side sectional view of stacked wafer structure 48 at a subsequent stage 116 of packaging. At activity 114, represented by FIG. 15, conductive elements 60 are formed on bump pads 58 of controller wafer 82. Conductive elements 60 may be copper pillars that are plated onto bump pads 58 of controller wafer 82. Alternatively, stud bumps or solder balls may be attached to bump pads 58 in accordance with conventional processes. Conductive elements 60 are formed on bump pads 58 of the bonded wafers of stacked structure 48 as a wafer-level process to achieve improvements in rotational accuracy of sensor package 20 to the product circuit. Formation of conductive elements 60 as a wafer-level process achieves accuracy improvements as compared with assembling a die into a sensor package, followed by assembling the sensor package into a product circuit. Accordingly, when sensor package 20 (FIG. 2) is eventually assembled to a product circuit by, for example, soldering, the location and rotation of sensor package 20 relative to the product circuit will be determined by the location and rotation of conductive elements 60 because the solder will align conductive elements 60 to the corresponding features on the product circuit.

With reference back to FIG. 3, following activity 114, packaging process 70 continues with an activity 118. At activity 118, when sensor dies 56 (FIG. 2) are part of the design configuration, sensor dies 56 may be mounted to controller wafer 82 at suitable locations directly on controller elements 24 of controller wafer 82.

Figure 16:
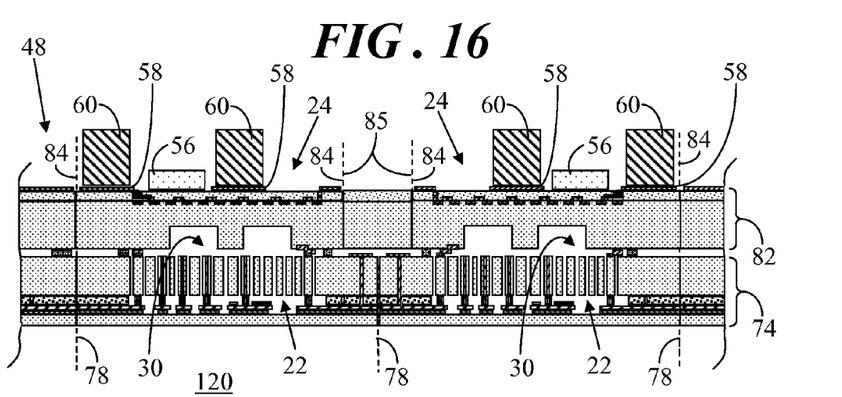
FIG. 16 shows a partial side sectional view of the stacked wafer structure of FIG. 15 at a subsequent stage of packaging.

Referring to FIG. 16 in connection with activity 118, FIG. 16 shows a partial side sectional view of stacked wafer structure 48 at a subsequent stage 120 of packaging. Sensor dies 56 may be bonded to controller wafer 82 by a die attach process and wire bonded to controller wafer 82. Alternatively, sensor dies 56 may be mounted to controller wafer 82 utilizing a flip chip technique in which sensor dies 56 are inverted and connected directly to controller elements 24 using, for example, solder bump mounting, stud bump bonding, and the like, rather than a conventional wire bonding technique.

A flip chip technique may achieve good rotation and tilt accuracy between sensor dies 56 and sensors 30 of the underlying sensor wafer 74. However, even implementation of a die attach process may achieve improvements in alignment accuracy between sensor dies 56 and sensors 30 since each controller element 24 on controller wafer 82 is bonded to the underlying sensor element 22 containing sensor 30 with the excellent rotation and tilt accuracies achieved with wafer-to-wafer bonding. More critically, however, the mounting of sensor dies 56 onto controller wafer 82 can achieve improved package density.

With reference back to FIG. 3, packaging process 70 continues with an activity 122 following activity 118. At activity 122, portions of controller wafer 82 are removed to reveal bond pads 32 (FIG. 2) on sensor wafer 74.

Figure 17:
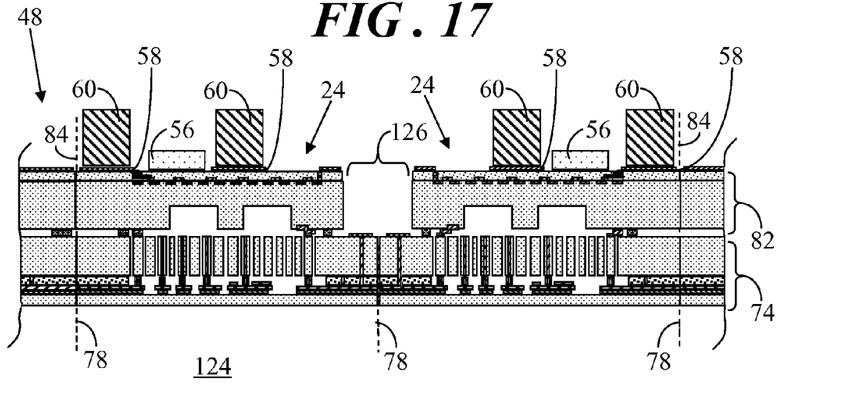
FIG. 17 shows a partial side sectional view of the stacked wafer structure of FIG. 16 at a subsequent stage of packaging.

Referring to FIG. 17 in connection with activity 122, FIG. 17 shows a partial side sectional view of stacked wafer structure 48 at a subsequent stage 124 of packaging. As shown in FIG. 17, portions 126 of controller wafer 82 are removed to expose, i.e., reveal, bond pads 32, of the underlying sensor wafer 74. Portions 126 may be removed by sawing along adjacent pairs 85 (see FIG. 16) of saw lines 84 in controller wafer 82.

Again, referring back to FIG. 3, once portions 126 of controller wafer 82 have been removed to expose, i.e., reveal, bond pads 32 at activity 122, packaging process 70 continues with an activity 128. At activity 128, bond wires 50 (FIG. 2) are attached between bond pads 32 (FIG. 2) of sensor wafer 74 and bond pads 44 (FIG. 2) of controller wafer 82.

Figure 18:
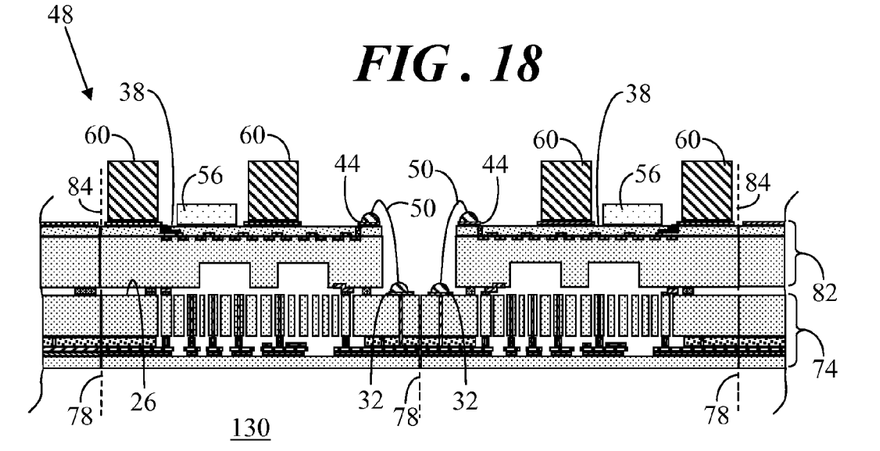
FIG. 18 shows a partial side sectional view of the stacked wafer structure of FIG. 17 at a subsequent stage of packaging.

Referring now to FIG. 18 in connection with activity 122, FIG. 18 shows a partial side sectional view of stacked wafer structure 48 at a subsequent stage 130 of packaging. As shown, bond wires 50 are bonded to bond pads 32 on upper side 26 of sensor wafer 74 and to corresponding bond pads 44 on upper side 38 of controller wafer 82 using a conventional wire bonding process. It should be observed that conductive elements 60 are higher than the wire bond loop height of bond wires 50. Wire bonding is a cost-effective and flexible interconnect technique, and can be readily implemented when forming electrical interconnects during a wafer-level fabrication process.

Referring back to FIG. 3, following wire bonding activity 128, packaging process 70 continues with an activity 132. At activity 132, packaging material 62 (FIG. 2) is applied to encapsulate stacked wafer structure 48.

Figure 19:
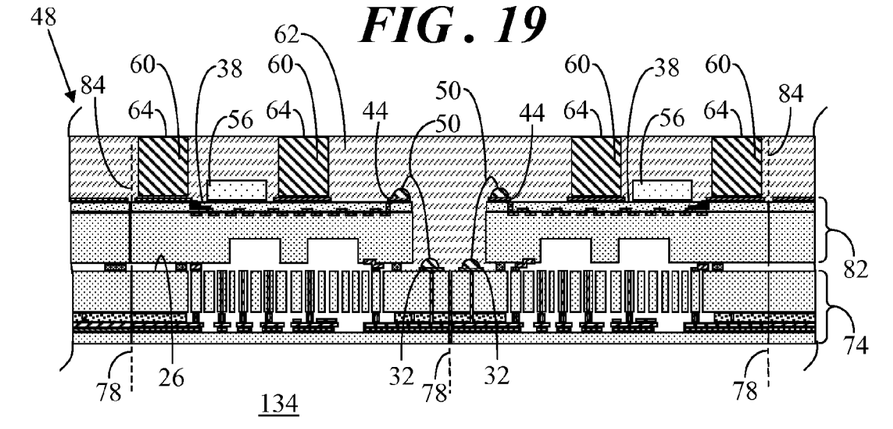
FIG. 19 shows a partial side sectional view of the stacked wafer structure of FIG. 18 at a subsequent stage of packaging.

With reference to FIG. 19 in connection with activity 132, FIG. 19 shows a partial side sectional view of stacked wafer structure 48 at a subsequent stage 134 of packaging. As shown in FIG. 19, conductive elements 60, upper side 38 of controller wafer 82, sensor die 56, bond wires 50, and exposed upper side 26 of sensor wafer 74 are encapsulated with packaging material 62. Packaging material 62 may be mold compound, potting compound, epoxy resin, and so forth, and packaging material 62 is applied in a thick enough layer to cover bond wires 50 and conductive elements 60. If packaging material 62 entirely covers conductive elements 60 during encapsulation, packaging material 62 may be ground down or otherwise abraded to expose top surface 64 of conductive elements 60 without exposing bond wires 50.

Again referring back to FIG. 3, following wire bonding activity 128 and/or encapsulation activity 132, continued processing may be performed which is not shown herein for brevity. This continued processing may entail the addition of solder balls above conductive elements 60. The added solder balls can increase standoff and improve the electrical interconnection Additional continued processing may entail visual inspection, operational testing, burn-in, stress testing, accelerated life testing, the build-up of additional redistribution layers above packaging material 62 and top surface 64 of conductive elements, and so forth all while still at wafer level.

Following activity 132, an activity 136 is eventually performed. At activity 136, the fabricated stacked wafer structure 48 is singulated, i.e., cut, punched, or diced, in a conventional manner. Following activity 136, packaging process 70 ends.

Figure 20:
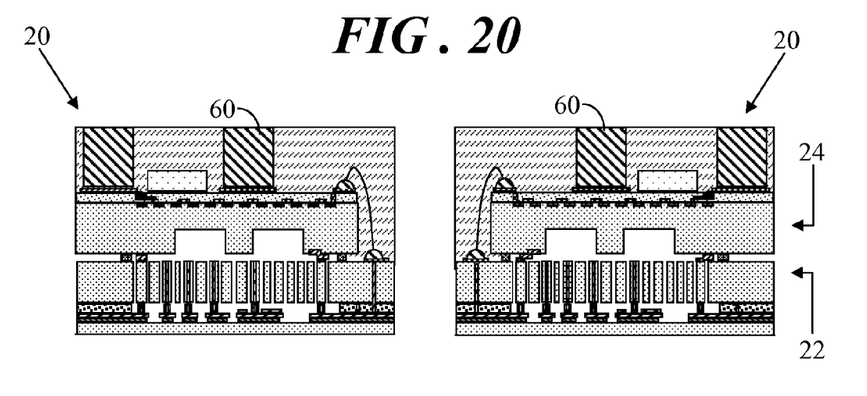
FIG. 20 shows a side sectional view of sensor packages produced from the stacked wafer structure of FIG. 19 in accordance with the packaging process of FIG. 3.

Referring to FIG. 20 in connection with activity 136, FIG. 20 shows a side sectional view of sensor packages 20 produced from stacked wafer structure 48 (FIG. 19) in accordance with packaging process 70. As shown, stacked wafer structure 48 has been singulated, i.e., cut, punched, or diced, along saw lines that correspond with saw lines 78 (see FIG. 19) of sensor wafer 74 and the remaining saw lines 84 (see FIG. 19) of controller wafer 82 to provide individual sensor packages 20. Following singulating activity 136, the individual sensor packages 20 can be coupled onto, for example, a printed circuit board in an end application. Each of the resulting sensor packages 20 represents a chip-scale package in which the x and y package dimensions are approximately equivalent to the x and y dimensions of sensor element 22. However, the z dimension, i.e., the thickness, of each sensor package 20 is approximately one hundred to two hundred microns larger than the thickness of the stacked wafer structure in order to accommodate conductive elements 60 and bond wires 50.

Embodiments described herein entail microelectronic sensor packaging methodology and a sensor package produced in accordance with the packaging methodology. The packaging methodology involves a wafer-level packaging technique in lieu of traditional die placement techniques. In accordance with the wafer-level packaging technique, the controller wafer is bonded to a sensor wafer to form a stacked wafer structure with the active side of the controller wafer facing outwardly from the package. Thus, the package inputs and outputs can be formed on the controller wafer. A portion of the stacked wafer structure is sawn, etched, or otherwise cut to reveal the underlying bond pads of the sensor wafer and the corresponding bond pads for the controller elements on the controller wafer are wire bonded to the sensor bond pads in wafer format. The wafer-level packaging process is especially suitable for the packaging of miniaturized sensors where precise rotation and tilt accuracy of the sensors can be achieved at the wafer level, rather than at the die level. Moreover, the required angular accuracy can be assured without more costly and time consuming testing. Accordingly, the wafer-level packaging process discussed herein provides high-throughput and precise placement packaging of sensors at relatively low cost. Moreover, the wafer-level packaging process results in individual sensor packages that are generally the same size as the die, stacking of sensors and microelectronic devices for size reduction and improved package density, enhanced electrical performance, and so forth. Additionally, the wafer structure and corresponding methodology are cost-effective, readily implemented, and adaptable to existing assembly and packaging tools and techniques.

Although the preferred embodiments of the invention have been illustrated and described in detail, it will be readily apparent to those skilled in the art that various modifications may be made therein without departing from the spirit of the invention or from the scope of the appended claims. For example, the process operations following wafer bonding can be performed in a differing order then that which was presented.

What is claimed is:
1. A method of forming sensor packages comprising:
providing a sensor wafer having a first side and a second side opposite said first side, said first side including sensors positioned within areas on said first side delineated by first bonding perimeters, and said sensor wafer including first bond pads formed on said first side outside of said areas delineated by said first bonding perimeters;

providing a controller wafer having a third side and a fourth side opposite said third side, said third side including control circuitry and second bond pads, and said fourth side including second bonding perimeters;

bonding said second bonding perimeters of said controller wafer to said first bonding perimeters of said sensor wafer to form a stacked wafer structure that includes multiple sensor packages;

removing portions of said controller wafer to reveal said first bond pads formed on said first side of said sensor wafer;

attaching bond wires between corresponding ones of said first and second bond pads; and singulating said stacked wafer structure to produce said sensor packages.

2. A method as claimed in claim 1 wherein said controller wafer exhibits an initial thickness, and said method further comprises prior to said bonding operation, backgrinding said fourth side of said controller wafer to a final thickness that is less than said initial thickness.

3. A method as claimed in claim 1 further comprising applying bonding material to said fourth side of said controller wafer at said second bonding perimeters.

4. A method as claimed in claim 1 further comprising forming features at said fourth side of said controller wafer prior to said bonding operation, said features being functional components of said sensors located at said first side of said sensor wafer.

5. A method as claimed in claim 4 wherein said features include cavities, and said forming operation comprises forming said cavities extending into said controller wafer from said fourth side such that said cavities are aligned with said sensors following said bonding operation.

6. A method as claimed in claim 4 wherein said features include electrodes, and said forming operation comprises forming said electrodes on said fourth side such that said electrodes are aligned with said sensors following said bonding operation.

7. A method as claimed in claim 1 wherein said sensor wafer exhibits an initial thickness, and said method further comprises backgrinding said second side of said sensor wafer following said bonding operation to a final thickness that is less than said initial thickness.

8. A method as claimed in claim 1 wherein said removing and attaching operations are performed prior to said singulating operation.

9. A method as claimed in claim 1 wherein said controller wafer includes bump pads formed on said third side, and said method further comprises forming conductive elements on said bump pads following said bonding operation.

10. A method as claimed in claim 9 further comprising applying a packaging material over said third side of said controller wafer to encapsulate said control circuitry and to at least partially encapsulate said conductive elements.

11. A method as claimed in claim 1 further comprising mounting sensor dies on said third side of said controller wafer following said bonding operation.

12. A method of forming sensor packages comprising:

providing a sensor wafer having a first side and a second side opposite said first side, said first side including sensors positioned within areas on said first side delineated by first bonding perimeters;

providing a controller wafer having a third side and a fourth side opposite said third side, said third side including control circuitry and said fourth side including second bonding perimeters;

bonding said second bonding perimeters of said controller wafer to said first bonding perimeters of said sensor wafer to form a stacked wafer structure that includes multiple sensor packages;

applying a packaging material over said third side of said controller wafer to encapsulate said control circuitry; and singulating said stacked wafer structure to produce said sensor packages, said singulating operation being performed following said applying operation.

13. A method of forming sensor packages comprising:

providing a sensor wafer having a first side and a second side opposite said first side, said first side including sensors positioned within areas on said first side delineated by first bonding perimeters, and said first side further including first bond pads positioned outside of said areas;

providing a controller wafer having a third side and a fourth side opposite said third side, said third side including control circuitry and second bond pads, and said fourth side including second bonding perimeters;

bonding said second bonding perimeters of said controller wafer to said first bonding perimeters of said sensor wafer to form a stacked wafer structure that includes multiple sensor packages;

removing portions of said controller wafer to reveal said first bond pads formed on said first side of said sensor wafer;

attaching bond wires between corresponding ones of said first and second bond pads;

applying a packaging material over said third side of said controller wafer to encapsulate said control circuitry and said bond wires; and following said applying operation, singulating said stacked wafer structure to produce said sensor packages.

14. A method as claimed in claim 13 wherein said controller wafer exhibits an initial thickness, and said method further comprises prior to said bonding operation, backgrinding said fourth side of said controller wafer to a final thickness that is less than said initial thickness.

15. A method as claimed in claim 13 further comprising forming features at said fourth side of said controller wafer prior to said bonding operation, said features being functional components of said sensors located at said first side of said sensor wafer.

* * * * *